(12) United States Patent
Meyer et al.

(10) Patent No.: US 10,128,205 B2
(45) Date of Patent: Nov. 13, 2018

(54) EMBEDDED DIE FLIP-CHIP PACKAGE ASSEMBLY

(71) Applicant: Intel Corporation, Santa Clara, CA (US)

(72) Inventors: Thorsten Meyer, Regensburg (DE); Sven Albers, Regensburg (DE)

(73) Assignee: Intel Corporation, Santa Clara, CA (US)

( * ) Notice: Subject to any disclaimer, the term of this patent is extended or adjusted under 35 U.S.C. 154(b) by 217 days.

(21) Appl. No.: 14/199,545

(22) Filed: Mar. 6, 2014

(65) Prior Publication Data

US 2015/0255412 A1 Sep. 10, 2015

(51) Int. Cl.
*H01L 23/02* (2006.01)
*H01L 23/00* (2006.01)
(Continued)

(52) U.S. Cl.
CPC ............ *H01L 24/09* (2013.01); *G06F 1/1613* (2013.01); *H01L 23/3114* (2013.01); *H01L 23/3135* (2013.01); *H01L 23/49816* (2013.01); *H01L 23/5226* (2013.01); *H01L 23/5389* (2013.01); *H01L 24/17* (2013.01); *H01L 24/19* (2013.01); *H01L 25/0657* (2013.01); *H01L 25/105* (2013.01); *H01L 25/50* (2013.01); *H01L 23/49822* (2013.01); *H01L 23/49827* (2013.01); *H01L 23/50* (2013.01); *H01L 24/13* (2013.01);
(Continued)

(58) Field of Classification Search
CPC ....... H01L 25/0657; H01L 2224/12105; H01L 2224/73204; H01L 24/17

USPC ........ 257/686, 777, 778, 786; 438/107, 108, 438/109
See application file for complete search history.

(56) References Cited

U.S. PATENT DOCUMENTS

2011/0272814 A1* 11/2011 Wachtler et al. ............. 257/773
2012/0032314 A1   2/2012 Chen et al.
(Continued)

FOREIGN PATENT DOCUMENTS

KR     20130077032 A     7/2013
TW     TW200945459 A    11/2009

OTHER PUBLICATIONS

Partial European Search Report dated Aug. 11, 2015, issued in corresponding European Application No. 15152958.3, 10 pages.
(Continued)

*Primary Examiner* — S. V. Clark
(74) *Attorney, Agent, or Firm* — Schwabe, Williamson & Wyatt, P.C.

(57) ABSTRACT

Embodiments of the present disclosure describe integrated circuit (IC) package assemblies and methods of fabricating IC package assemblies. These embodiments include dies embedded in embedding substrates to provide larger pitch interconnects to facilitate coupling to substrates or circuit boards through flip chip techniques. The embedding substrates may contain conductive pathways for coupling die contacts to larger pitch contacts located on the embedding substrate. By embedding the dies in the embedding substrates, dies having smaller pitch contacts can be used in package assemblies with larger pitch components without the need for silicon interposers and without having to utilize more stringent pick and place operations. Other embodiments may be described and/or claimed.

25 Claims, 11 Drawing Sheets

(51) Int. Cl.

| | |
|---|---|
| *H01L 23/31* | (2006.01) |
| *H01L 23/498* | (2006.01) |
| *H01L 23/538* | (2006.01) |
| *H01L 25/10* | (2006.01) |
| *G06F 1/16* | (2006.01) |
| *H01L 23/522* | (2006.01) |
| *H01L 25/065* | (2006.01) |
| *H01L 25/00* | (2006.01) |
| *H01L 23/50* | (2006.01) |

(52) U.S. Cl.
CPC .............. *H01L 24/14* (2013.01); *H01L 24/16* (2013.01); *H01L 24/32* (2013.01); *H01L 24/73* (2013.01); *H01L 2224/0401* (2013.01); *H01L 2224/04105* (2013.01); *H01L 2224/06181* (2013.01); *H01L 2224/0903* (2013.01); *H01L 2224/12105* (2013.01); *H01L 2224/131* (2013.01); *H01L 2224/1403* (2013.01); *H01L 2224/14181* (2013.01); *H01L 2224/16227* (2013.01); *H01L 2224/1712* (2013.01); *H01L 2224/2518* (2013.01); *H01L 2224/32225* (2013.01); *H01L 2224/73204* (2013.01); *H01L 2225/1023* (2013.01); *H01L 2225/1035* (2013.01); *H01L 2225/1047* (2013.01); *H01L 2225/1058* (2013.01); *H01L 2924/14* (2013.01); *H01L 2924/1434* (2013.01); *H01L 2924/15172* (2013.01); *H01L 2924/15311* (2013.01); *H01L 2924/15331* (2013.01); *H01L 2924/181* (2013.01)

(56) References Cited

U.S. PATENT DOCUMENTS

| | | | |
|---|---|---|---|
| 2012/0193812 A1* | 8/2012 | Toh et al. ................ 257/774 |
| 2013/0175686 A1 | 7/2013 | Meyer et al. | |
| 2013/0182402 A1 | 7/2013 | Chen et al. | |
| 2014/0021583 A1 | 1/2014 | Lo et al. | |
| 2014/0191419 A1* | 7/2014 | Mallik ............... H01L 25/0652 257/777 |
| 2014/0312475 A1* | 10/2014 | Ali ..................... H01L 23/5384 257/666 |
| 2015/0108661 A1* | 4/2015 | Vincent ................. H01L 24/30 257/777 |
| 2015/0162316 A1* | 6/2015 | Yu ........................ H01L 25/105 257/704 |

OTHER PUBLICATIONS

Extended European Search Report dated Mar. 8, 2016 for European Application No. 15152958.3, 24 pages.

\* cited by examiner

EMBEDDED DIE FLIP-CHIP PACKAGE ASSEMBLY

FIELD

Embodiments of the present disclosure generally relate to the field of integrated circuits package assemblies, and more particularly, embedded die assemblies for integrated circuit packages as well as methods for fabricating package assemblies employing embedded die assemblies.

BACKGROUND

As package assemblies become more complicated and integrated circuit (IC) dies become smaller it becomes increasingly difficult to provide reliable interconnects in a cost effective manner. In particular, as dies include more contacts within smaller areas at decreased pitches new packaging schemes will be required to route signals from these contacts to package-level contacts and other components. One suggestion has been the use of silicon interposers utilizing through silicon vias (TSVs) to couple dies with package-level components having larger pitches. These interposers are expensive and currently lack an adequate supply chain to be a viable large scale packaging option.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
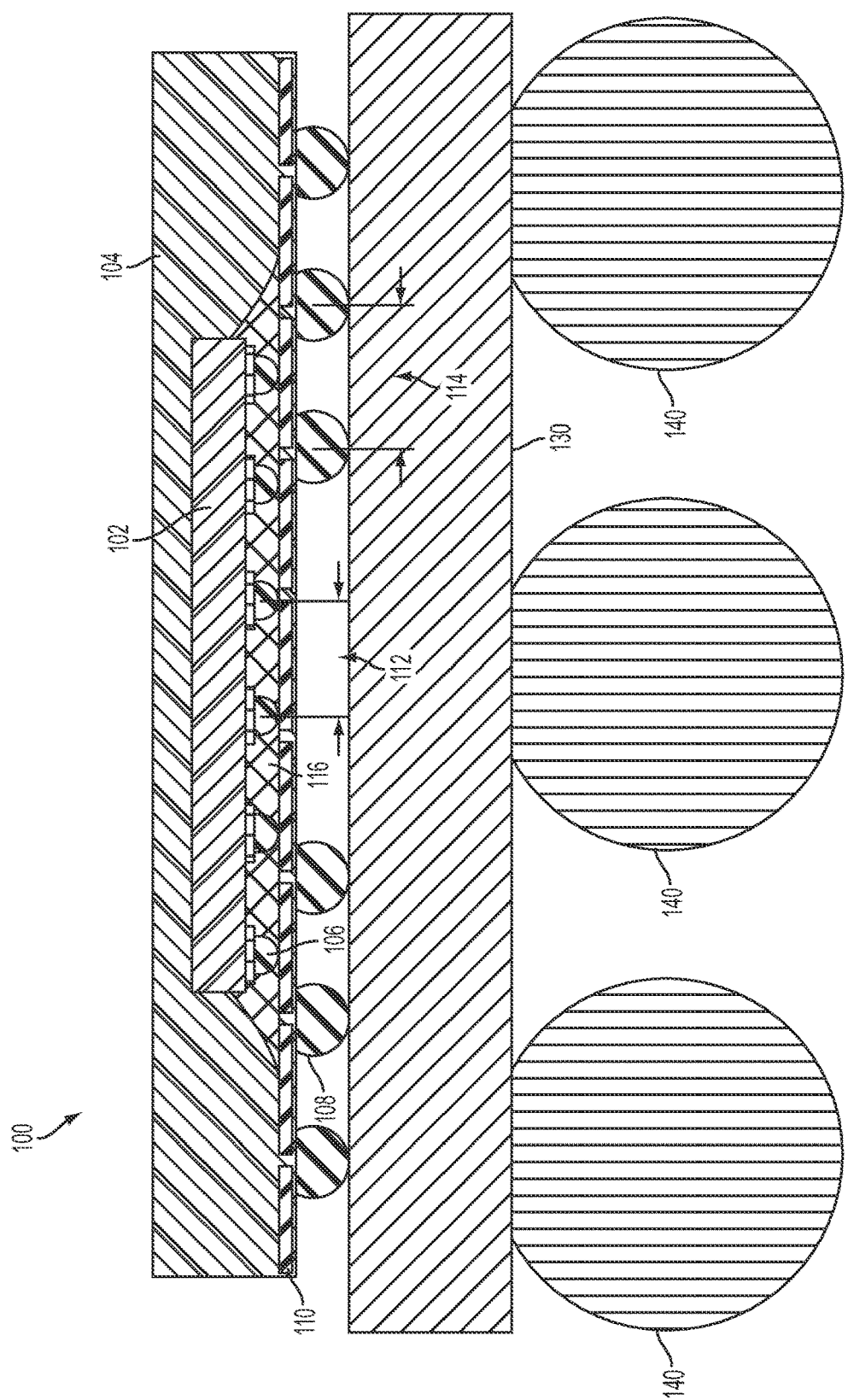
FIG. 1 schematically illustrates a cross-section side view of a package assembly using a silicon interposer.

Embodiments of the present disclosure describe package assemblies including embedded dies to cost effectively provide flip-chip packages for dies having smaller contact pitches as well as methods for fabricating such package assemblies. By embedding the die, it is possible to provide larger pitch contacts for coupling with a package substrate without using silicon interposers. This may result in cost effective packaging solutions that leverage current fabrication techniques without requiring expensive silicon interposers or other supply chain development. Such embedded die package assemblies may allow new dies with smaller pitch contacts to be utilized with current flip-chip mounting and packaging techniques generally associated with larger pitch contacts.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," "in embodiments," or "in some embodiments," which may each refer to one or more of the same or different embodiments. Furthermore, the terms "comprising," "including," "having," and the like, as used with respect to embodiments of the present disclosure, are synonymous.

The term "coupled with" along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

FIG. 1 illustrates a package assembly 100 including a die 102 mounted to a silicon interposer 110. The die 102 may have die contacts (shown here as solder bumps 106) that have a first pitch 112. Die 102 may be coupled to a silicon interposer 110 which includes TSVs coupled to contacts (shown here as ball grid array (BGA) 108) having a second pitch 114. The package assembly 100 may include an underfill material 116 as well as an overmold material 104. The silicon interposer 110 may be aligned with a printed circuit board (PCB) interposer substrate 130. The PCB interpose substrate may include a ball grid array (BGA) 140 for connection to a circuit board or other component. The BGA 140 may have a pitch that is larger than pitch 112 or pitch 114. As can be seen in FIG. 1, all electrical routing is included in the relatively thin silicon interposer 110. Also, as the pitch 112 of the die contacts 106 decreases (as more die contacts are included in smaller areas) the accuracy required when placing the die on the silicon interposer 110 increases. The fabrication techniques required to form the silicon interposer 110, as well as the increased accuracy required for the pick and place operation, may render this solution too expensive for many applications. As such, it would be desirable to have package assemblies that can be used with dies having small pitch contacts that do not require silicon interposers and which may utilize currently available pick and place operations. FIGS. 2-9 illustrate different variations of embedded die package assemblies that allow dies having increasingly small pitch contacts to be mounted in flip-chip arrangements with currently available pick and place operations and without expensive silicon interposers.

Figure 2:
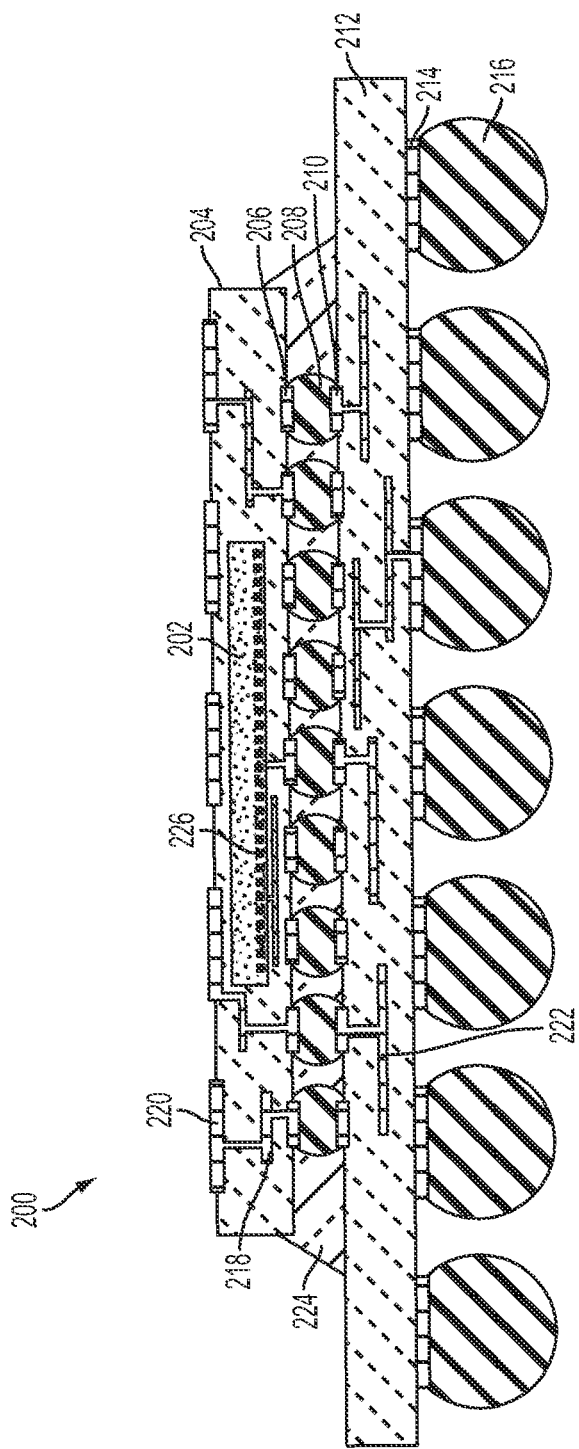
FIG. 2 schematically illustrates a cross-section side view of a package assembly including an underfilled embedded die, in accordance with some embodiments.

FIG. 2 illustrates a package assembly 200 including a die 202 encapsulated in an embedding substrate 204. Die 202 may include die contacts 226 having a relatively small pitch. The embedding substrate 204 may include conductive pathways 218. The conductive pathways 218 may electrically couple the die contacts 226 to contacts 206 and/or 220 located on opposing sides of the embedding substrate 204. Solder bumps or conductive pillars (shown as solder bumps 208) may be attached to contacts 206 to facilitate the coupling of the embedding substrate 204 to a package-level substrate 212. Contacts 206 and 220 may have a pitch that is greater than that of die contacts 226. Contacts 206 and 220 may have the same pitch or different pitches.

The package-level substrate 212 may include contacts 210 to which the solder bumps or conductive pillars (shown as solder bumps 208) may be coupled. Contacts 210 may have the same pitch as contacts 206. Package-level substrate 212 may include conductive pathways 222 to electrically couple contacts 210 with contacts 214. Contacts 214 may have a larger pitch than contacts 210. A ball grid array (BGA) 216 or other interconnect may be coupled to contacts 214 to facilitate coupling the package assembly 200 to a circuit board or other component. An underfill material 224 may be included at the junction between the embedding substrate 204 and the package-level substrate 212.

By embedding die 202 in the embedding substrate 204 contacts 206 may be provided with a larger pitch than die contacts 226. This may allow the use of existing pick and place operations when attaching the embedding substrate 204 to the package-level substrate 212 via solder bumps 208 and contacts 210. As will be discussed in more detail later, embedding substrate 204 and conductive pathways 218 may be formed using known techniques that are also cost effective. As such, dies with small pitch contacts may be embedded in embedding substrates to realize larger pitch interconnects (such as combination of contacts 206, 210 and solder bumps 208) to facilitate their incorporation via flip-chip arrangements with substrates and circuit boards utilizing traditional larger pitch interconnects. This can be achieved without using expensive silicon interposers or requiring more accurate pick and place operations. Furthermore, various embodiments as discussed below can readily incorporate surface mount devices, package on package (POP) devices, and landing pad mounted devices with little need for additional processing steps because the necessary contacts and interconnects may be incorporated into the embedding substrate 204 or the package-level substrate 212 during the formation of other structures.

Each of FIGS. 3-9 shows a variation of the package assembly discussed above with reference to FIG. 2. As such, only distinguishing features are discussed and common elements are not specifically labeled for clarity. It should be understood that the different elements of the package assemblies shown in FIGS. 3-9 may be combined in any number of ways and although a particular combination or arrangement may not be shown it is considered within scope of this disclosure.

Figure 3:
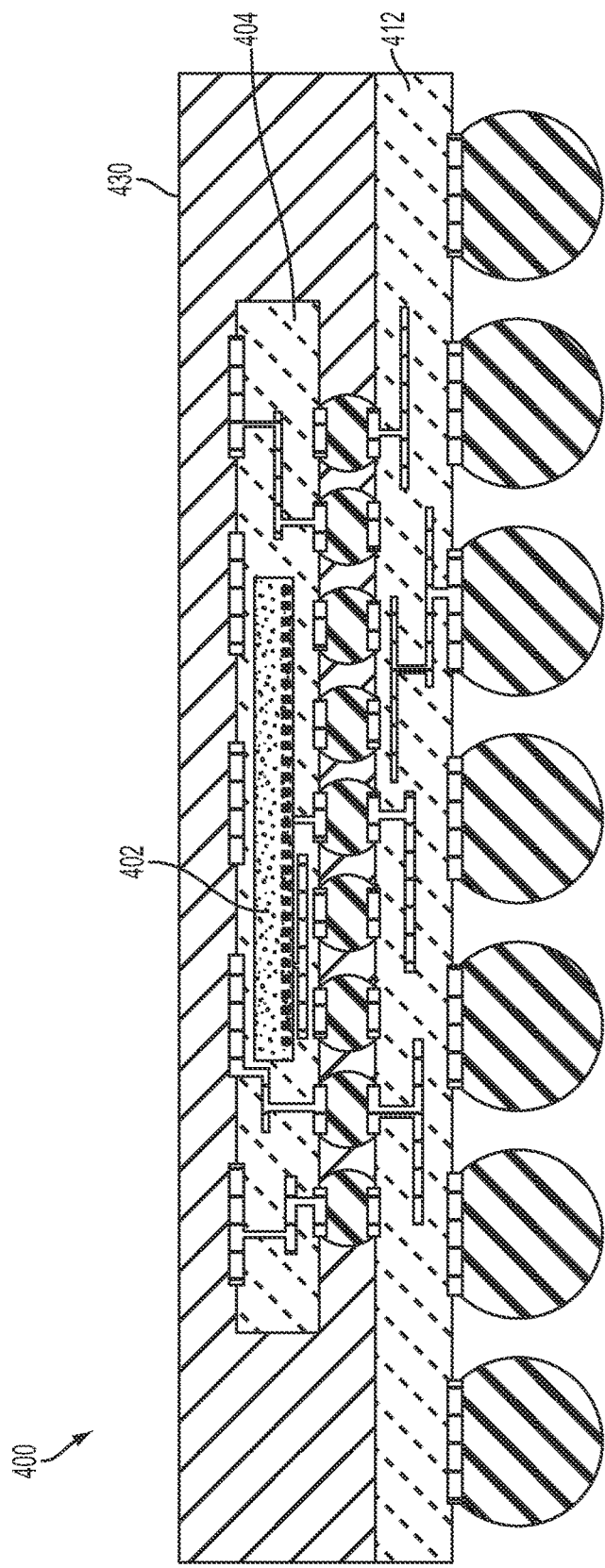
FIG. 3 schematically illustrates a cross-section side view of a package assembly including an overmolded embedded die, in accordance with some embodiments.

FIG. 3 illustrates a package assembly 400 including a die 402 encapsulated in an embedding substrate 404. Similar to package assembly 200 discussed above regarding FIG. 2, embedding substrate 404 is coupled to a package-level substrate 412 which is configured to be coupled to a circuit board or another component. Unlike FIG. 2, which included underfill material 224, package assembly 400 may be overmolded with a mold compound 430. While shown as alternatives, it may also be possible to overmold package assembly 200 resulting in a package assembly with both underfill material and overmold material.

Figure 4:
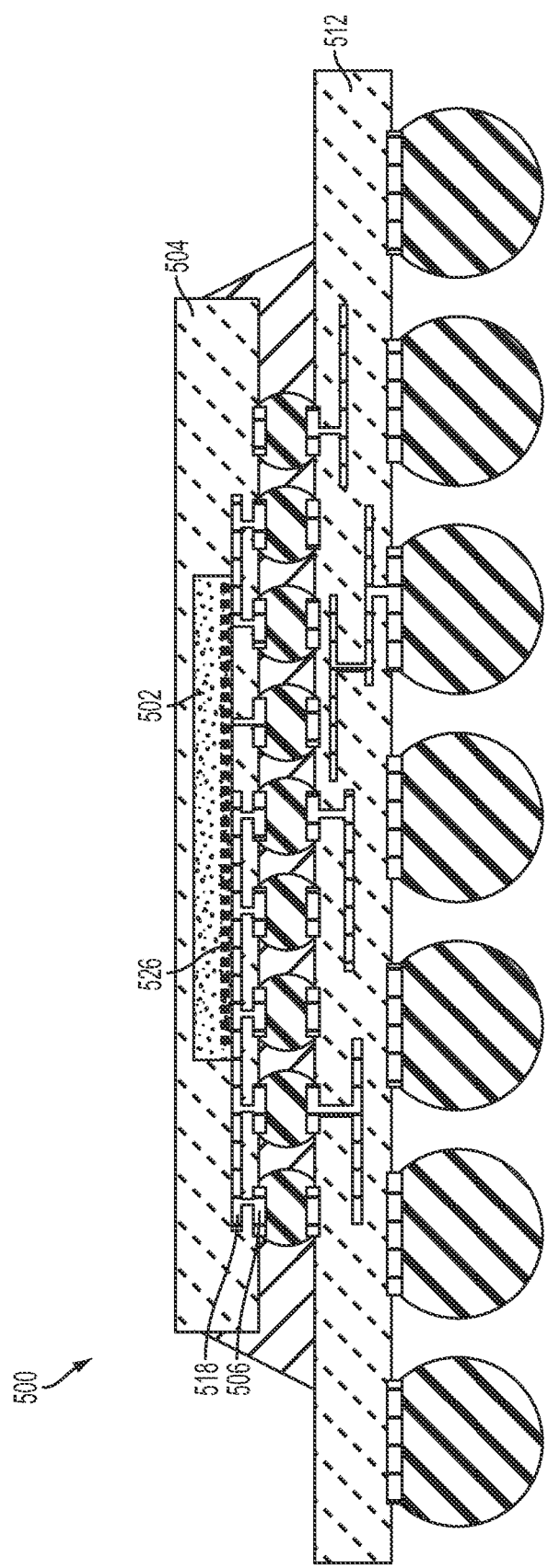
FIG. 4 schematically illustrates a cross-section side view of a package assembly, in accordance with some embodiments.

FIG. 4 illustrates a package assembly 500 including a die 502 encapsulated in an embedding substrate 504. In this embodiment the die 502 may be embedded face down such that the die contacts 526 are located on the surface of the die closest to contacts 506 (bottom of embedding substrate 504 as shown). The embedding substrate 504 may include conductive pathways 518 that electrically couple the die contacts 526 to contacts 506. In this instance contacts are only disposed on one side of the embedding substrate (no upper surface contacts are present) and the conductive pathways may be formed within the embedding substrate such that they are located between the die 502 and the contacts 506. The absence of the conductive pathways in the embedding substrate in portions equal in height with the die 502 or above the die 502 may decrease the number of processing steps and thus the cost of fabrication. For instance, fewer redistribution layers (RDLs) may be needed when forming embedding substrate 504 as compared to previously discussed embedding substrates (e.g., 204, 404). As discussed previously the embedding substrate 504 may be coupled to a package-level substrate 512.

Figure 5:
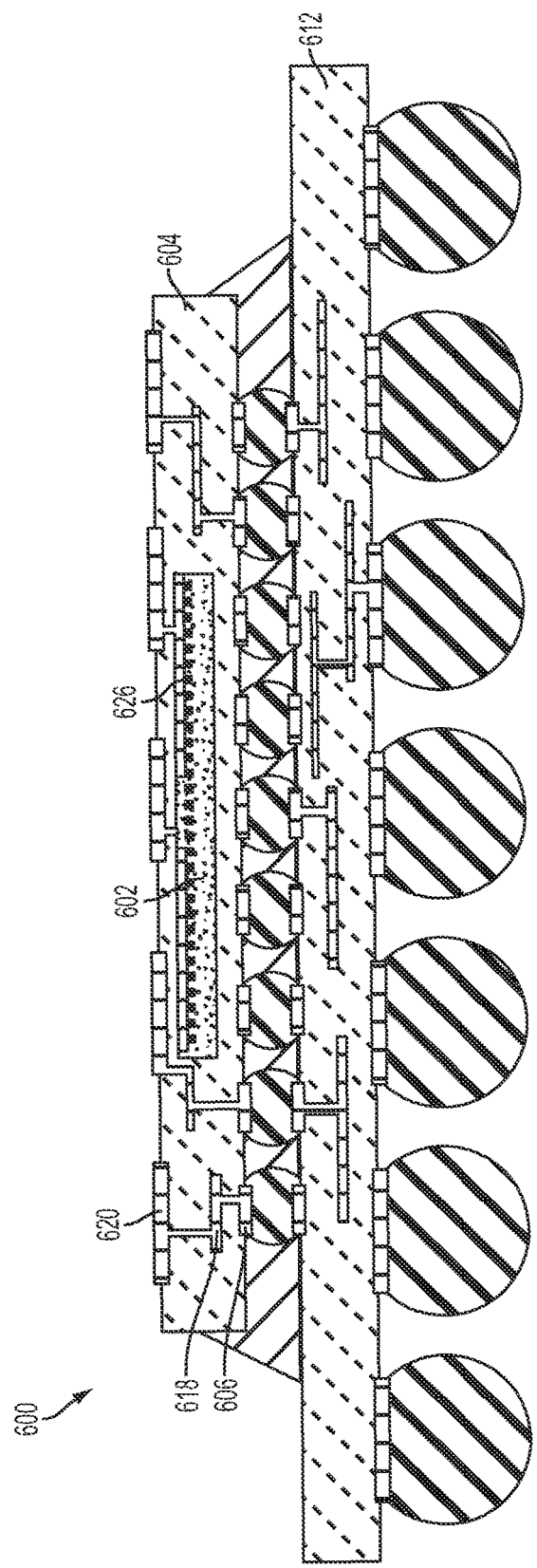
FIG. 5 schematically illustrates a cross-section side view of a package assembly, in accordance with some embodiments.

FIG. 5 illustrates a package assembly 600 including a die 602 encapsulated in an embedding substrate 604. In this embodiment the die 602 is embedded face up such that the die contacts 626 are located on the side of the die 602 further from the contacts 606 (shown as top of die 602). Embedding substrate 604 may contain conductive pathways 618 to electrically couple die contacts 626 to contacts 606 and/or 620. As discussed previously the embedding substrate 604 may be coupled to a package-level substrate 612. It should be understood that the die orientation (face up vs. face down) may be changed for any embodiment and alterations of the specific embodiments shown with dies in varying orientations (along with conductive pathways to match) are considered within the scope of this disclosure.

Figure 6:
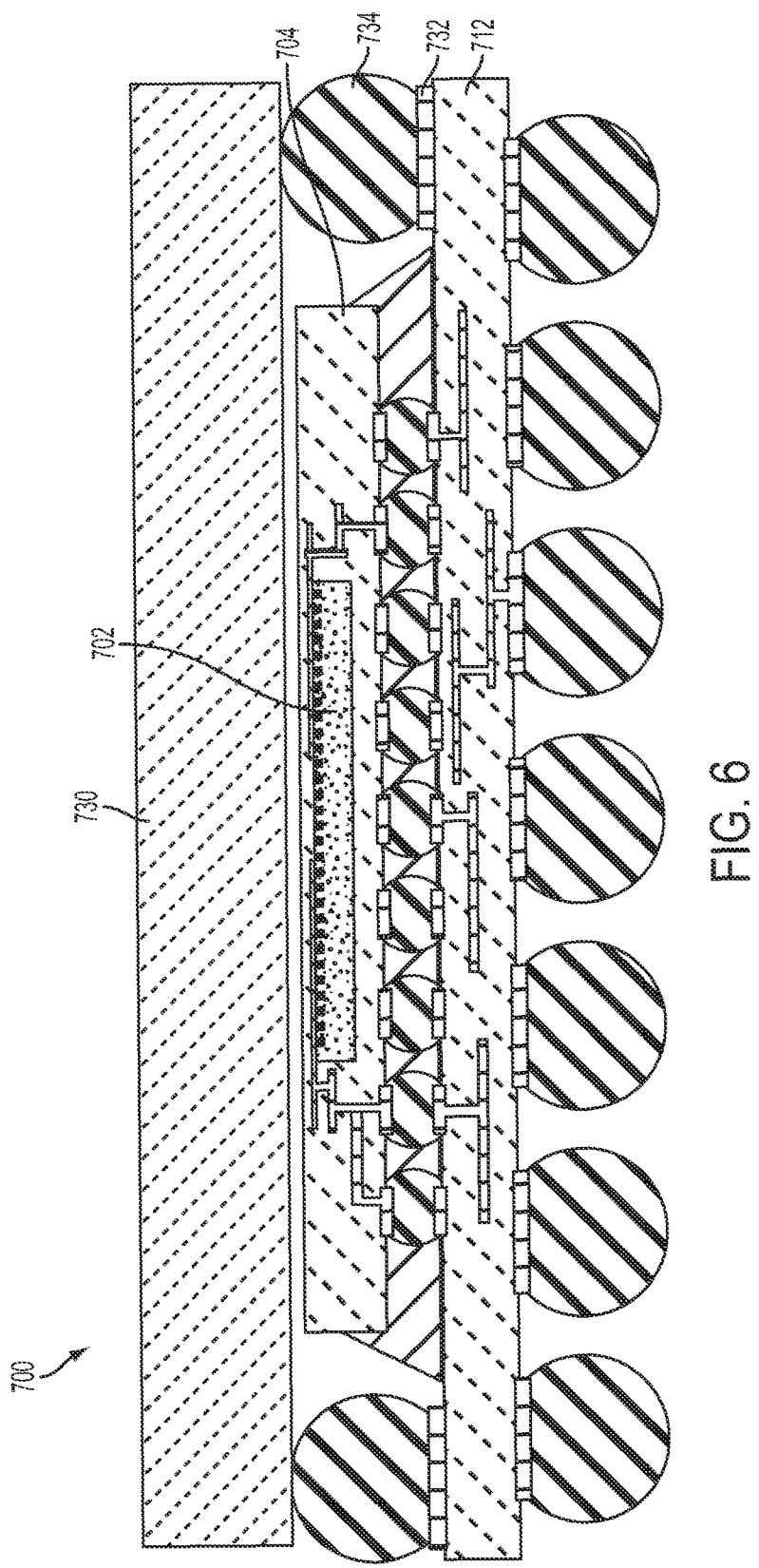
FIG. 6 schematically illustrates a cross-section side view of a package assembly including a device mounted on landing pads, in accordance with some embodiments.

FIG. 6 illustrates a package assembly 700 including a die 702 encapsulated in an embedding substrate 704. As discussed previously the embedding substrate 704 may be coupled to a package-level substrate 712. In this embodiment the package-level substrate 712 may include landing pads 732. Landing pads 732 may be located in a region of the package-level substrate 712 that is outside of an area defined by the combination of the die 702 and the embedding substrate 704. The landing pads 732 may be electrically coupled to other contacts on the package-level substrate 712 by way of conductive pathways defined in the package-level substrate 712. The landing pads 732 may facilitate the addition of a device 730 which may be coupled to the landing pads 732 by solder balls 734, or by any other suitable technique. The device 730 may include a memory device or other active or passive devices. In this embodiment, the device 730 may only be attached to the landing pads 732 around the periphery of the embedding substrate 704. In some embodiments though, the device may be attached directly to contacts (such as contacts 220, 620 etc.) located on an upper surface of the embedding substrate. Such attachments may be in place of, or in addition to, the attachments to the landing pads 732.

Figure 7:
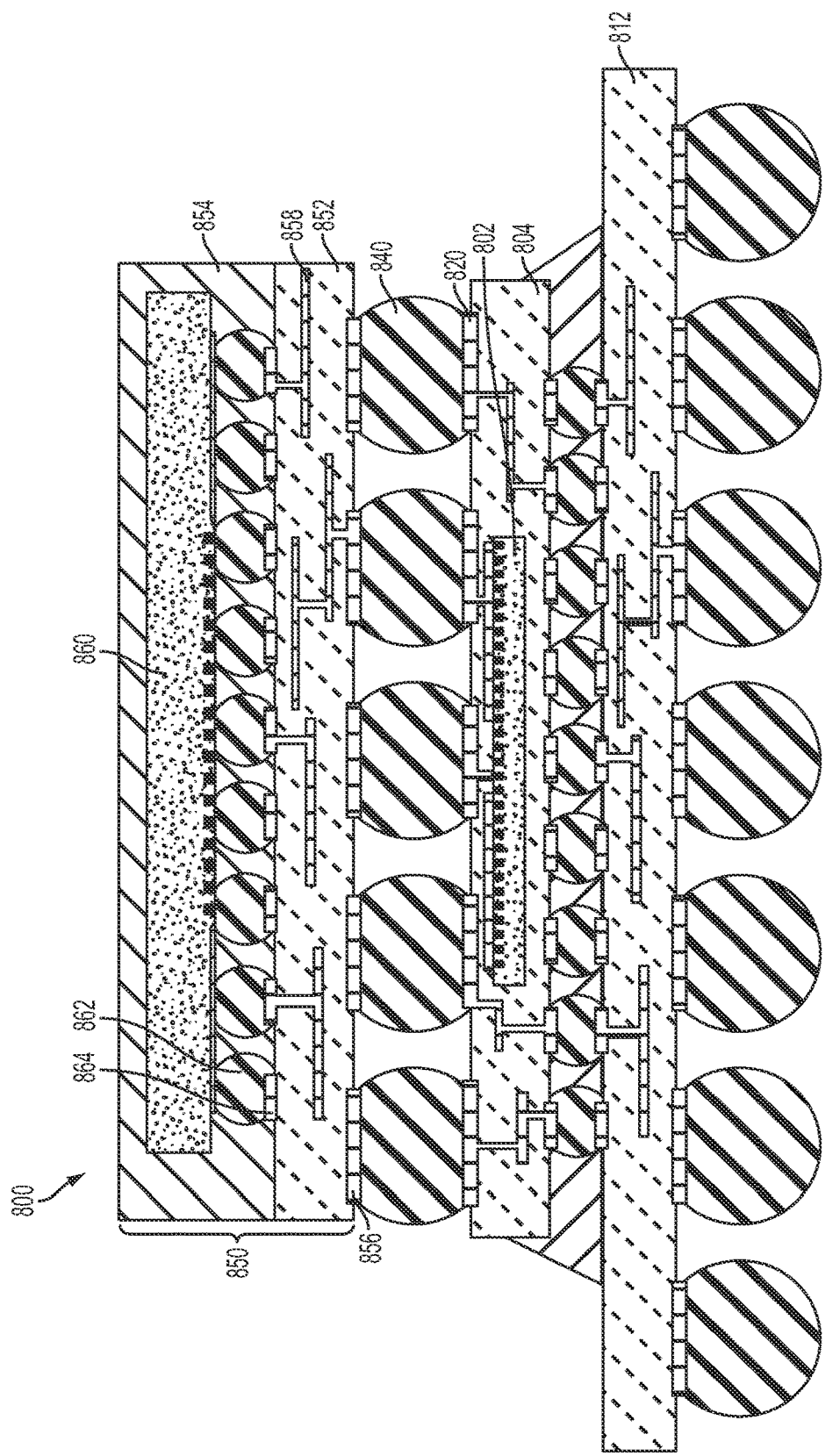
FIG. 7 schematically illustrates a cross-section side view of a package assembly including a package on package (POP) device, in accordance with some embodiments.

FIG. 7 illustrates a package assembly 800 including a die 802 encapsulated in an embedding substrate 804. As discussed previously the embedding substrate 804 may be coupled to a package-level substrate 812. In this embodiment a package on package (POP) device 850 is shown directly attached to the embedding substrate 804 via contacts 820 and solder balls 840. The POP device 850 may include a die 860 coupled to a POP substrate 852 via solder bumps 862 and contacts 864. POP substrate 852 may include conductive pathways 858 to electrically couple contacts 864 to contacts 856. The die 860 may include any active or passive devices including, but not limited to processors and/or memory.

Figure 8:
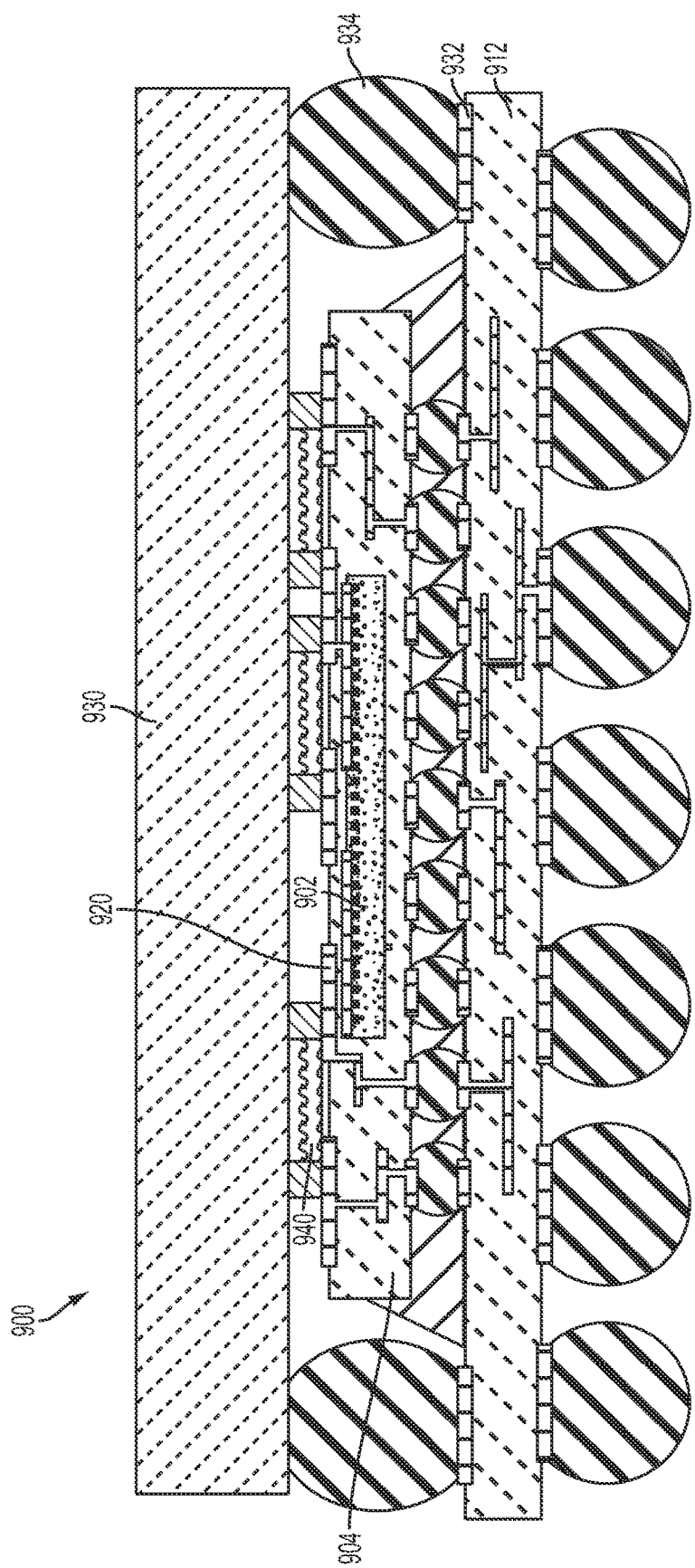
FIG. 8 schematically illustrates a cross-section side view of a package assembly including a device mounted on landing pads as wells as surface mounted devices, in accordance with some embodiments.

FIG. 8 illustrates a package assembly 900 including a die 902 encapsulated in an embedding substrate 904. As discussed previously the embedding substrate 904 may be coupled to a package-level substrate 912. Similar to FIG. 7, package-level substrate 912 may include landing pads 932 to which a device 930 may be coupled via solder balls 934. Package assembly 900 may also include surface mount devices (SMDs) 940 coupled to contacts 920. In this instance the SMDs 940 are located between the embedding substrate 904 and the device 930, although SMDs may be included in instances where device 930 is not included. SMDs 940 may include a variety of active or passive devices. SMDs 940 may include memory, power amplifiers, surface or bulk acoustic wave filters as well as other devices.

Figure 9:
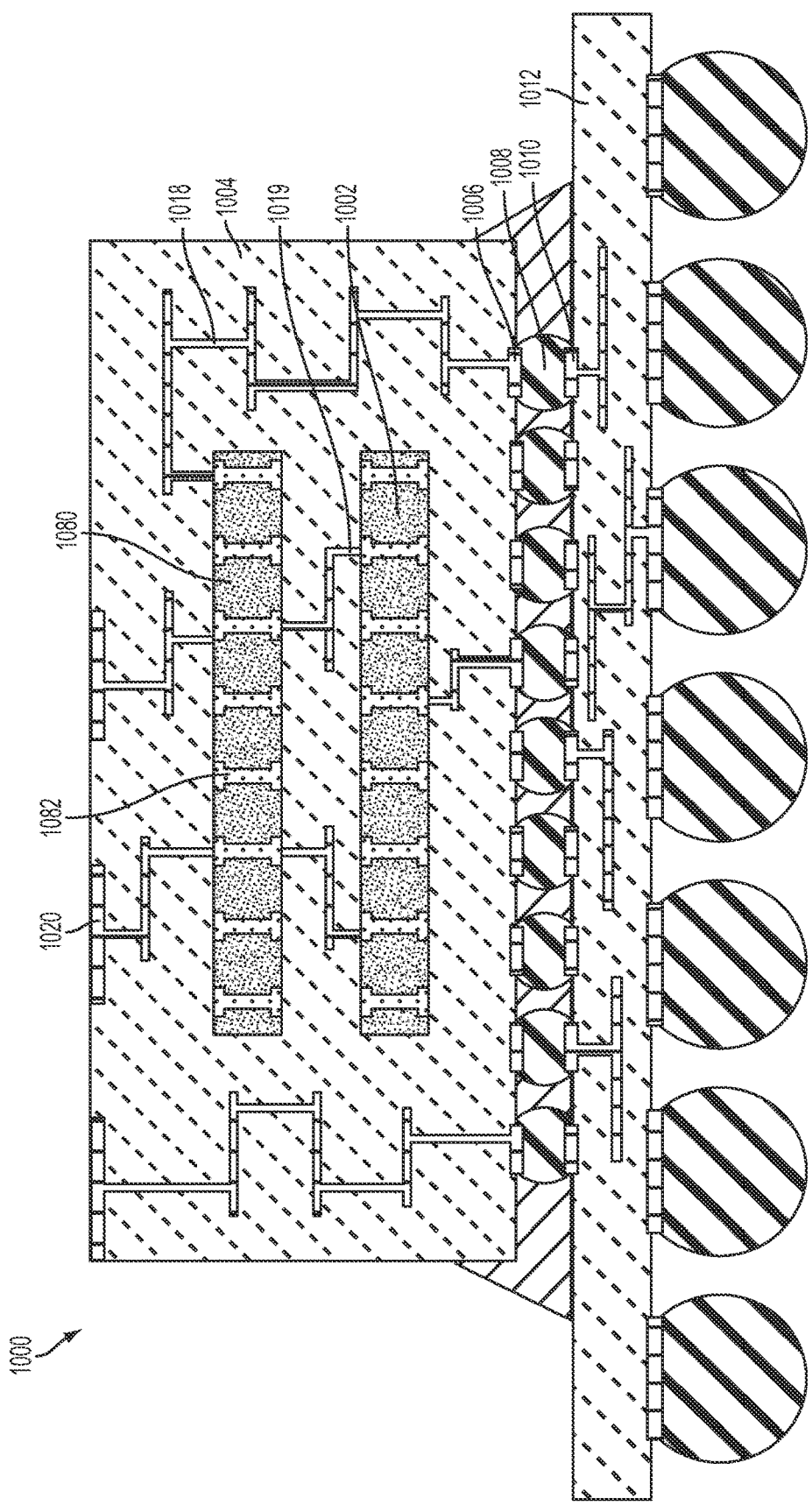
FIG. 9 schematically illustrates a cross-section side view of a package assembly including multiple embedded dies including TSVs, in accordance with some embodiments.

FIG. 9 illustrates a package assembly 1000 including two dies 1002 and 1080 encapsulated in an embedding substrate 1004. As discussed previously the embedding substrate 1004 may be coupled to a package-level substrate 1012 such as shown via contacts 1006 and 1010 with solder bumps 1008. Embedding substrate 1004 may include conductive pathways 1018 to couple die contacts to contacts 1006 and/or 1020. One, or both dies 1002 and 1080, may include TSVs 1082. TSVs 1082 may eliminate the need for some conductive pathways and allow the dies 1002 and 1080 to be coupled in a face to face manner via conductive pathways 1019. Although shown with two dies, any number of dies may be embedded in embedding substrate 1004. Multiple dies can be stacked vertically as shown, located at the same height spaced apart horizontally, or a combination of both. While shown with TSVs, multiple dies may be embedded without including TSVs and TSVs may be included in single die arrangements such as those discussed previously. Also multiple die arrangements and/or TSVs may be used in any of the embodiments discussed herein.

Figure 10:
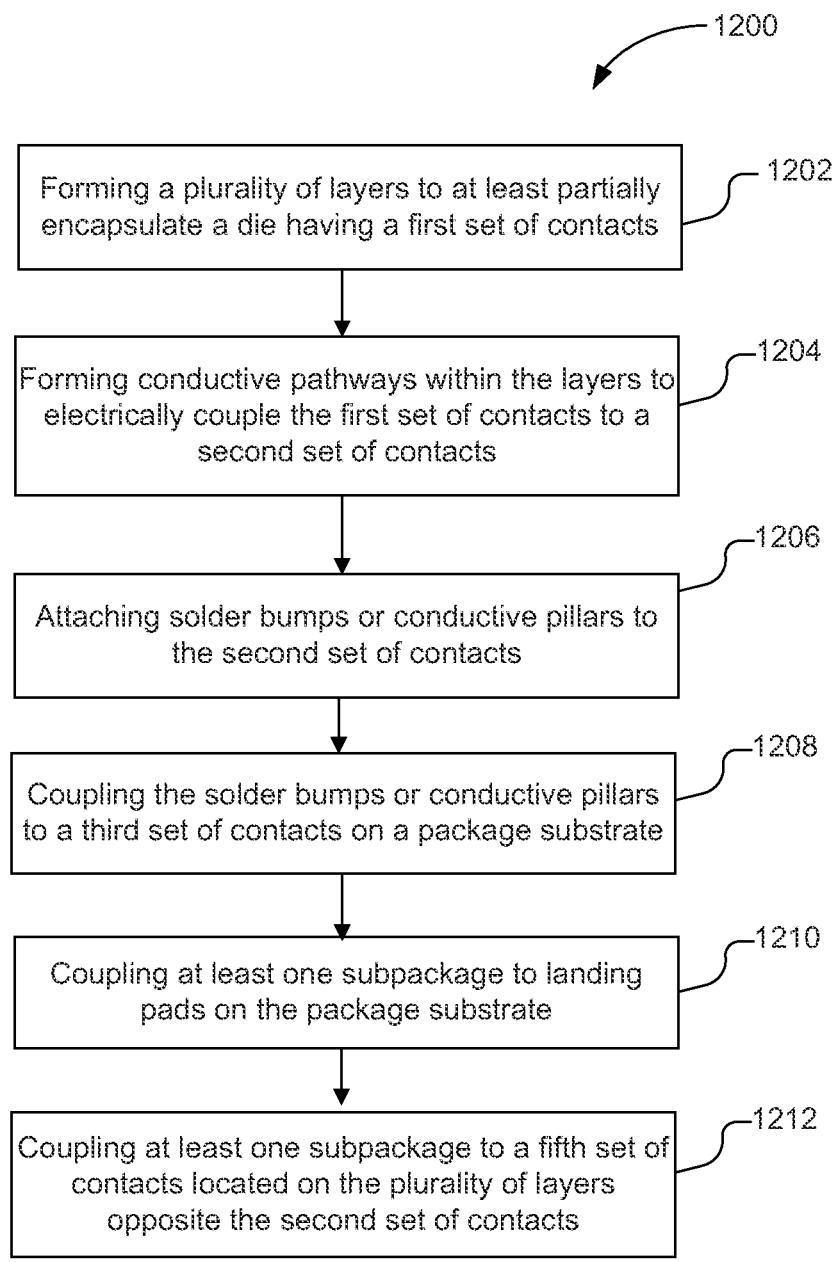
FIG. 10 schematically illustrates a flow diagram of a method of fabricating a package assembly, in accordance with some embodiments.

FIG. 10 schematically illustrates a flow diagram of a method 1200 of fabricating a package assembly (e.g., the package assemblies of FIGS. 2-9) in accordance with some embodiments.

At 1202 the method 1200 may include forming a plurality of layers to at least partially encapsulate a die having a first set of contacts. This may include forming the embedding substrates discussed above with reference to FIGS. 2-9. Any suitable technique may be used to form the layers and encapsulate the die. This operation may include fully encapsulating the die within the layers.

At 1204 the method 1200 may include forming conductive pathways within the layers to electrically couple the first set of contacts to a second set of contacts. This may include forming the conductive pathways discussed previously with regarding the FIGS. 2-9 and coupling die contacts to contacts on a surface of the layers (e.g., the surface of an embedding substrate). This may include an iterative process that is intermixed with the formation of the layers in a laminating or build-up process.

At 1206 the method 1200 may include attaching solder bumps or conductive pillars to the second set of contacts. Any suitable techniques and materials may be used in this operation. This operation may include attaching solder bumps such as those shown in FIGS. 2-9 (e.g., solder bumps 208).

At 1208 the method 1200 may include coupling the solder bumps or conductive pillars to a third set of contacts on a package substrate. Any suitable techniques may be used to perform this operation. This operation may include coupling the embedding substrate to the package-level substrate as discussed above in reference to FIGS. 2-9. After this operation the general package assembly has been assembled, but additional operations as discussed below may also be included.

At 1210 the method 1200 may include coupling at least one subpackage to landing pads on the package substrate. This may include coupling a subpackage such as 730 or 930 to landing pads on the package substrate. Any suitable techniques may be used to complete this operation.

At 1212 the method 1200 may include coupling at least one subpackage to a fifth set of contacts located on the plurality of layers (e.g., the embedding substrate) opposite the second set of contacts. This may include coupling a POP package (e.g., POP package 850) or a surface mound device (e.g., surface mount device 940) to the fifth set of contacts. Any suitable techniques may be used to complete this operation.

Figure 11:
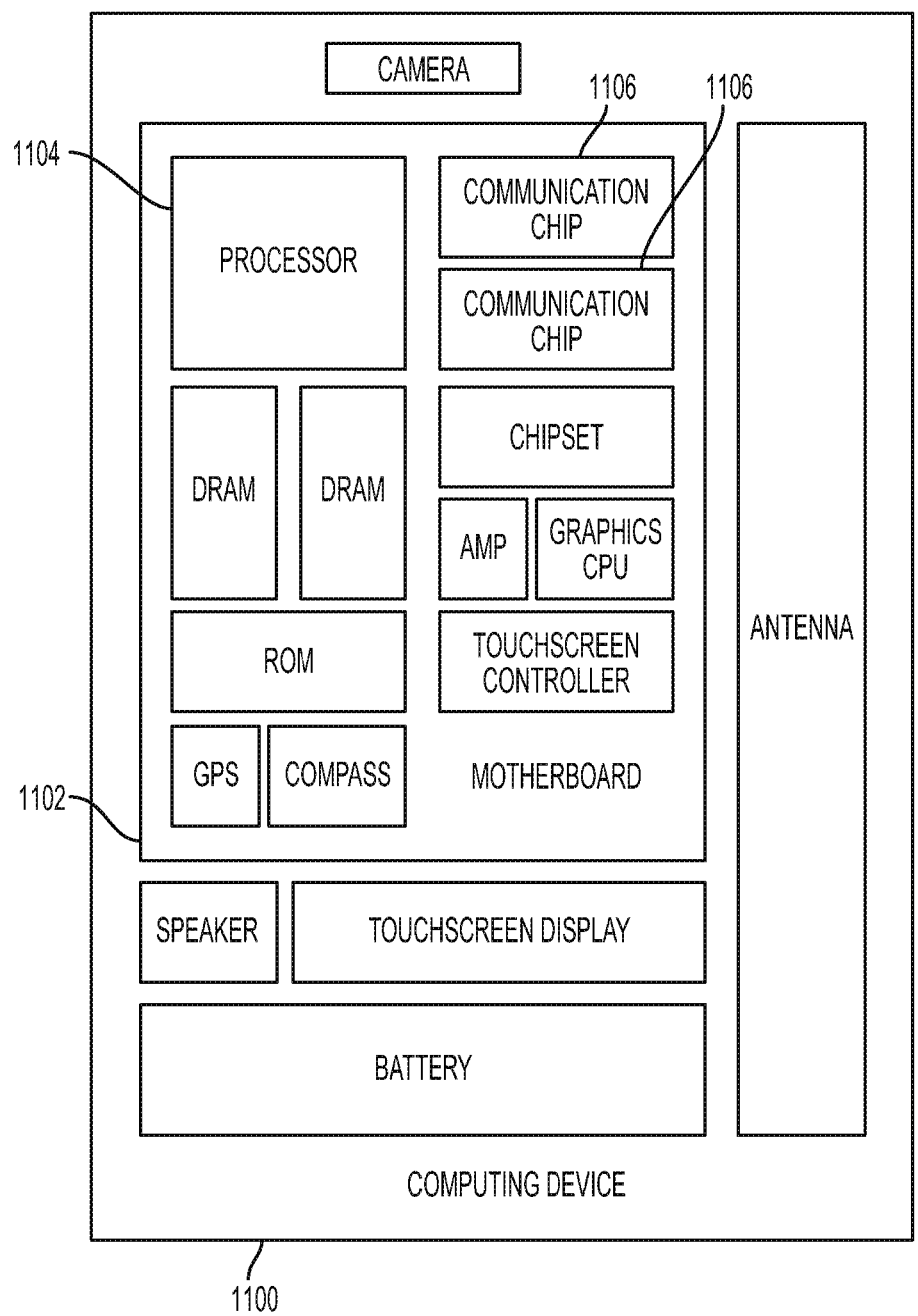
FIG. 11 schematically illustrates a computing device that includes a package assembly as described herein, in accordance with some embodiments.

Embodiments of the present disclosure may be implemented into a system using any suitable hardware and/or software to configure as desired. FIG. 11 schematically illustrates a computing device 1100 that includes an IC package assembly (e.g., one or more of package assemblies according to any of FIGS. 2-9) as described herein, in accordance with some embodiments. The computing device 1100 may include housing to house a board such as motherboard 1102. Motherboard 1102 may include a number of components, including but not limited to processor 1104 and at least one communication chip 1106. Processor 1104 may be physically and electrically coupled to motherboard 1102. In some implementations, the at least one communication chip 1106 may also be physically and electrically coupled to motherboard 1102. In further implementations, communication chip 1106 may be part of processor 1104.

Depending on its applications, computing device 1100 may include other components that may or may not be physically and electrically coupled to motherboard 1102. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

Communication chip 1106 may enable wireless communications for the transfer of data to and from computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 1106 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. Communication chip 1106 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1106 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1106 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. Communication chip 1106 may operate in accordance with other wireless protocols in other embodiments.

Computing device 1100 may include a plurality of communication chips 1106. For instance, a first communication chip 1106 may be dedicated to shorter range wireless communications such as Wi-Fi and Bluetooth, and a second communication chip 1106 may be dedicated to longer range wireless communications such as GPS, EDGE, GPRS, CDMA, WiMAX, LTE, Ev-DO, and others.

Processor 1104 of computing device 1100 may be packaged in an IC assembly (e.g., one or more of package assemblies according to any of FIGS. 2-9 as described herein). For example, processor 1104 may correspond with die 202 etc. The package assembly (e.g., one or more of package assemblies according to any of FIGS. 2-9) and motherboard 1102 may be coupled together using package-level interconnects such as BGA balls. The term "processor" may refer to any device or portion of a device that processes electronic data from registers and/or memory to transform that electronic data into other electronic data that may be stored in registers and/or memory.

Communication chip 1106 may also include a die that may be packaged in an IC assembly (e.g., one or more of package assemblies according to any of FIGS. 2-9) as described herein. In further implementations, another component (e.g., memory device or other integrated circuit device) housed within computing device 1100 may include a die that may be packaged in an IC assembly (e.g., one or more of package assemblies according to any of FIGS. 2-9) as described herein.

In various implementations, computing device 1100 may be a laptop, a netbook, a notebook, an Ultrabook™, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

Various operations are described as multiple discrete operations in turn, in a manner that is most helpful in understanding the claimed subject matter. However, the order of description should not be construed as to imply that these operations are necessarily order dependent.

EXAMPLES

Some non-limiting examples are provided below.

Example 1 includes a package assembly comprising: a die including a first set of contacts having a first pitch; an embedding substrate at least partially encapsulating the die and including a second set of contacts having a second pitch; conductive pathways defined in the embedding substrate to electrically couple the first set of contacts with the second set of contacts; and a package substrate configured to receive the die and embedding substrate in a flip-chip configuration, having a first side and a second side disposed opposite the first side and including: a third set of contacts disposed on the first side having a third pitch substantially equal to the second pitch; and a fourth set of contacts on the second side having a fourth pitch; wherein the second pitch is greater than the first pitch.

Example 2 includes the package assembly of example 1, wherein the embedding substrate fully encapsulates the die.

Example 3 includes the package assembly of example 1 further comprising: a plurality of either conductive pillars or solder bumps to electrically couple the second set of contacts to the third set of contacts.

Example 4 includes the package assembly of example 1, wherein the fourth pitch is greater than the third pitch.

Example 5 includes the package assembly of example 1, wherein the package substrate includes landing pads on the first side in an area outside of a region defined by the combination of the die and the embedding substrate; and wherein the package substrate includes conductive pathways to electrically couple the landing pads to contacts of the fourth set of contacts.

Example 6 includes the package assembly of any of examples 1-5, further comprising: a mold compound at least partially encapsulating the embedding substrate.

Example 7 includes the package assembly of any of examples 1-5, wherein the embedding substrate has a first side and a second side disposed opposite the first side and the second set of contacts is disposed on the first side of the embedding substrate; and the package assembly further includes: a fifth set of contacts disposed on the second side of the embedding substrate and electrically coupled to at least one of the first set of contacts or the second set of contacts by the conductive pathways defined in the embedding substrate.

Example 8 includes the package assembly of example 7, further comprising: at least one subpackage electrically coupled to at least one of the contacts of the fifth set of contacts.

Example 9 includes the package assembly of any of examples 1-5, wherein the die includes through silicon vias (TSVs).

Example 10 includes the package assembly of any of examples 1-5, further comprising: at least one additional die at least partially encapsulated in the embedding substrate.

Example 11 includes a method of making a package assembly, the method comprising: forming a plurality of layers to at least partially encapsulate a die including a first set of contacts having a first pitch; forming conductive pathways within the layers to electrically couple the first set of contacts to a second set of contacts disposed on a first side of the plurality of layers and having a second pitch; and attaching solder bumps or conductive pillars to the second set of contacts; coupling the solder bumps or conductive pillars to a third set of contacts on a first side of a package substrate; wherein the second pitch is greater than the first pitch.

Example 12 includes the method of example 11, wherein forming the plurality of layers fully encapsulates the die.

Example 13 includes the method of example 11, wherein the package substrate includes a fourth set of contacts on a second side of the package substrate having a fourth pitch that is greater than the second pitch and configured to couple with a circuit board.

Example 14 includes the method of example 11, further comprising: coupling at least one subpackage to landing pads disposed on the first side of the package substrate in an area outside of a region defined by the combination of the die and the plurality of layers.

Example 15 includes the method of any of examples 11-14, wherein forming conductive pathways within the layers includes forming conductive pathways to electrically couple a fifth set of contacts disposed on a second side of the plurality of layers to at least one of the first or second set of contacts.

Example 16 includes the method of example 15, further comprising: coupling at least one subpackage to at least one contact of the fifth set of contacts.

Example 17 includes the method of any of examples 11-14, wherein forming the plurality of layers to at least partially encapsulate the die includes at least partially encapsulating an additional die and at least one of the dies includes through silicon vias (TSVs).

Example 18 includes a computing device comprising: a circuit board; and a package assembly coupled with the circuit board, the package assembly including: a die including a first set of contacts having a first pitch; an embedding substrate at least partially encapsulating the die and including a second set of contacts having a second pitch; conductive pathways defined in the embedding substrate to electrically couple the first set of contacts with the second set of contacts; and a package substrate configured to receive the die and embedding substrate in a flip-chip configuration, having a first side and a second side disposed opposite the first side and including: a third set of contacts disposed on the first side having a third pitch substantially equal to the second pitch; and a fourth set of contacts on the second side having a fourth pitch; wherein the second pitch is greater than the first pitch.

Example 19 includes the computing device of example 18, wherein the embedding substrate fully encapsulates the die.

Example 20 includes the computing device of example 18, wherein the package assembly is coupled to the circuit board via the fourth set of contacts.

Example 21 includes the computing device of example 18, wherein the fourth pitch is greater than the third pitch.

Example 22 includes the computing device of example 18, wherein the package substrate includes landing pads on the first side in an area outside of a region defined by the combination of the die and the embedding substrate; and wherein the package substrate includes conductive pathways to electrically couple the landing pads to contacts of the fourth set of contacts.

Example 23 includes the computing device of example 18, wherein the embedding substrate has a first side and a second side disposed opposite the first side and the second set of contacts is disposed on the first side of the embedding substrate; and the package assembly further includes: a fifth set of contacts disposed on the second side of the embedding substrate and electrically coupled to at least one of the first set of contacts or the second set of contacts by the conductive pathways defined in the embedding substrate.

Example 24 includes the computing device of claim 23 wherein the package assembly includes at least one subpackage electrically coupled to at least one of the contacts of the fifth set of contacts.

Example 25 includes the computing device of any of claims 18-24, wherein: the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A package assembly comprising:
    a die including a first set of contacts having a first pitch;
    an embedding substrate at least partially encapsulating the die and including a second set of contacts having a second pitch, the embedding substrate including a first side and a second side and an underfill-free substrate material between the first side and the second side;
    conductive pathways defined in the embedding substrate to electrically couple the first set of contacts with the second set of contacts, wherein the conductive pathways are within the embedding substrate, and the conductive pathways are located between the die and the second set of contacts; and
    a package substrate configured to receive the die and embedding substrate in a flip-chip configuration, having a first side and a second side disposed opposite the first side and including:
        a third set of contacts disposed on the first side having a third pitch substantially equal to the second pitch; and
        a fourth set of contacts on the second side having a fourth pitch;
            wherein the second pitch is greater than the first pitch.

2. The package assembly of claim 1, wherein the embedding substrate fully encapsulates the die.

3. The package assembly of claim 1 further comprising:
    a plurality of either conductive pillars or solder bumps to electrically couple the second set of contacts to the third set of contacts.

4. The package assembly of claim 1, wherein the fourth pitch is greater than the third pitch.

5. The package assembly of claim 1, wherein the package substrate includes landing pads on the first side in an area outside of a region defined by a combination of the die and the embedding substrate; and
    wherein the package substrate includes conductive pathways to electrically couple the landing pads to contacts of the fourth set of contacts.

6. The package assembly of claim 1, further comprising:
    a mold compound at least partially encapsulating the embedding substrate.

7. The package assembly of claim 1, wherein the embedding substrate has a first side and a second side disposed opposite the first side and the second set of contacts is disposed on the first side of the embedding substrate; and the package assembly further includes:
    a fifth set of contacts disposed on the second side of the embedding substrate and electrically coupled to at least one of the first set of contacts or the second set of contacts by the conductive pathways defined in the embedding substrate.

8. That package assembly of claim 7, further comprising:
    at least one subpackage electrically coupled to at least one of the contacts of the fifth set of contacts.

9. The package assembly of claim 1, wherein the die includes through silicon vias (TSVs).

10. The package assembly of claim 1, further comprising:
    at least one additional die at least partially encapsulated in the embedding substrate.

11. A method of making a package assembly, the method comprising:
    forming a plurality of layers of substrate to at least partially encapsulate a die including a first set of contacts having a first pitch, wherein the plurality of layers of the substrate are free of an underfill material;
    forming conductive pathways within the layers to electrically couple the first set of contacts to a second set of contacts disposed on a first side of the plurality of layers and having a second pitch, wherein the conductive pathways are within the plurality of layers of the substrate, and the conductive pathways are located between the die and the second set of contacts; and
    attaching solder bumps or conductive pillars to the second set of contacts;
    coupling the solder bumps or conductive pillars to a third set of contacts on a first side of a package substrate;
    wherein the second pitch is greater than the first pitch.

12. The method of claim 11, wherein forming the plurality of layers fully encapsulates the die.

13. The method of claim 11, wherein the package substrate includes a fourth set of contacts on a second side of the package substrate having a fourth pitch that is greater than the second pitch and configured to couple with a circuit board.

14. The method of claim 11, further comprising:
    coupling at least one subpackage to landing pads disposed on the first side of the package substrate in an area outside of a region defined by a combination of the die and the plurality of layers.

15. The method of claim 11, wherein forming conductive pathways within the layers includes forming conductive pathways to electrically couple a fifth set of contacts disposed on a second side of the plurality of layers to at least one of the first or second set of contacts.

16. The method of claim 15, further comprising:
    coupling at least one subpackage to at least one contact of the fifth set of contacts.

17. The method of claim 11, wherein forming the plurality of layers to at least partially encapsulate the die includes at least partially encapsulating an additional die and at least one of the dies includes through silicon vias (TSVs).

18. A computing device comprising:
    a circuit board; and
    a package assembly coupled with the circuit board, the package assembly including:
        a die including a first set of contacts having a first pitch;
        an embedding substrate at least partially encapsulating the die and including a second set of contacts having a second pitch, wherein the embedding substrate includes a unitary body that includes a substrate material and is free of an underfill material;

conductive pathways defined in the embedding substrate to electrically couple the first set of contacts with the second set of contacts, wherein the conductive pathways are within the embedding substrate, and the conductive pathways are located between the die and the second set of contacts; and a package substrate configured to receive the die and embedding substrate in a flip-chip configuration, having a first side and a second side disposed opposite the first side and including:
  a third set of contacts disposed on the first side having a third pitch substantially equal to the second pitch; and
  a fourth set of contacts on the second side having a fourth pitch;
  wherein the second pitch is greater than the first pitch.

19. The computing device of claim 18, wherein the embedding substrate fully encapsulates the die.

20. The computing device of claim 18, wherein the package assembly is coupled to the circuit board via the fourth set of contacts.

21. The computing device of claim 18, wherein the fourth pitch is greater than the third pitch.

22. The computing device of claim 18, wherein the package substrate includes landing pads on the first side in an area outside of a region defined by a combination of the die and the embedding substrate; and
  wherein the package substrate includes conductive pathways to electrically couple the landing pads to contacts of the fourth set of contacts.

23. The computing device of claim 18, wherein the embedding substrate has a first side and a second side disposed opposite the first side and the second set of contacts is disposed on the first side of the embedding substrate; and the package assembly further includes:
  a fifth set of contacts disposed on the second side of the embedding substrate and electrically coupled to at least one of the first set of contacts or the second set of contacts by the conductive pathways defined in the embedding substrate.

24. The computing device of claim 23 wherein the package assembly includes at least one subpackage electrically coupled to at least one of the contacts of the fifth set of contacts.

25. The computing device of claim 18, wherein:
  the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

* * * * *